(12) United States Patent
Nardi et al.

(10) Patent No.: US 10,943,952 B2
(45) Date of Patent: Mar. 9, 2021

(54) THRESHOLD SWITCH FOR MEMORY

(71) Applicant: SanDisk Technologies LLC, Addison, TX (US)

(72) Inventors: Federico Nardi, San Jose, CA (US); Ming-Che Wu, San Jose, CA (US); Tim Minvielle, San Jose, CA (US); Zhaoqiang Bai, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/435,843

(22) Filed: Jun. 10, 2019

(65) Prior Publication Data

US 2020/0388650 A1 Dec. 10, 2020

(51) Int. Cl.
*H01L 45/00* (2006.01)
*H01L 27/24* (2006.01)
*G11C 13/00* (2006.01)

(52) U.S. Cl.
CPC ........ *H01L 27/2454* (2013.01); *G11C 13/004* (2013.01); *G11C 13/0026* (2013.01); *G11C 13/0028* (2013.01); *G11C 13/0069* (2013.01); *G11C 13/0097* (2013.01); *H01L 45/1206* (2013.01); *H01L 45/141* (2013.01); *H01L 45/145* (2013.01); *G11C 2213/34* (2013.01); *G11C 2213/71* (2013.01); *G11C 2213/79* (2013.01)

(58) Field of Classification Search
CPC .......................... H01L 27/2454; H01L 45/126
See application file for complete search history.

(56) References Cited

U.S. PATENT DOCUMENTS

| 7,916,514 B2 | 3/2011 | Wicker |
| 9,230,985 B1 | 1/2016 | Wu et al. |
| 2004/0178401 A1 | 9/2004 | Ovshinsky et al. |
| (Continued) | | |

FOREIGN PATENT DOCUMENTS

KR 1020180013035 A 2/2018

OTHER PUBLICATIONS

International Search Report and Written Opinion, PCT/US2019/067157, dated Jul. 2, 2020.

*Primary Examiner* — Moazzam Hossain
(74) *Attorney, Agent, or Firm* — Dickinson Wright PLLC; Steven Hurles

(57) ABSTRACT

The switching device includes three terminals including an inner surface, an oxide layer on the inner surface of the third terminal, and a chalcogenide pillar extending through the oxide layer and the third terminal, the pillar being in electrical communication with the first terminal and the second terminal, wherein the voltage difference between the first terminal and the second terminal changes the channel from a first state to a second state when a threshold voltage between the first terminal and the second terminal is exceeded, the threshold voltage being dependent on temperature. The third terminal is resistive and receives a control signal to apply heat to the pillar and modulate the threshold voltage. The switching device can be used to select the memory stack through the bitline and provide a nearly limitless current based on the threshold switching conduction providing avalanche current conduction through the switching device.

18 Claims, 11 Drawing Sheets

(56) References Cited

U.S. PATENT DOCUMENTS

| | | | |
|---|---|---|---|
| 2007/0279974 A1* | 12/2007 | Dennison | G11C 13/0004 |
| | | | 365/163 |
| 2010/0123114 A1* | 5/2010 | Seko | H01L 27/2463 |
| | | | 257/2 |
| 2018/0233177 A1* | 8/2018 | Laurent | G11C 5/025 |
| 2018/0331284 A1 | 11/2018 | BrightSky et al. | |
| 2019/0064551 A1* | 2/2019 | Gooth | G02F 1/0147 |
| 2019/0088316 A1* | 3/2019 | Inuzuka | G11C 13/0023 |
| 2020/0127052 A1* | 4/2020 | Walker | H01L 27/2463 |

\* cited by examiner

THRESHOLD SWITCH FOR MEMORY

TECHNICAL FIELD

This disclosure relates to memory systems, and in particular, to memory methods and systems with a threshold phase change switch.

BACKGROUND

Memory systems use transistors to access memory cells in memory systems.

SUMMARY

This disclosure relates generally to a chalcogenide switch for use in a memory system and/or memory methods. The switch can be a threshold switch, which provides an avalanche type conduction once turned on.

An aspect of the disclosed embodiments includes a threshold switch for a vertical non-volatile memory, which includes a source, a drain, and a vertical channel extending from the source to the drain, wherein the channel includes a chalcogenide material, the channel including a first, resistive state and a second, conductive state, wherein the voltage difference between the source and the drain changes the channel from the first state to the second state when a threshold voltage is exceeded. In an aspect of the disclosure an electrical insulation layer extends around the channel and a conductive layer extending around the electrical insulation layer and the vertical channel, wherein the conductive layer receives an electrical signal to apply thermal energy to the vertical channel to lower the threshold voltage.

In an aspect of the disclosure, the conductive layer receives a current to heat the channel and not apply an electrical field to change the conductivity of the channel.

In an aspect of the disclosure, the electrical insulation layer separates the conductive layer from the vertical channel and is intermediate the drain and the conductive layer.

In an aspect of the disclosure, the electrical insulation layer completely surrounds the channel.

In an aspect of the disclosure, the conductive layer at least partly surrounds electrical insulation layer.

In an aspect of the disclosure, the first state is amorphous and the second state is electronic highly conductive.

In an aspect of the disclosure, the channel is aligned with vertical memory cells.

In an aspect of the disclosure, the electrical insulation layer includes a gate oxide material, and wherein the conductive layer includes a gate oxide.

In an aspect of the disclosure, the source is connected to a global bit line in a nonvolatile memory.

In an aspect of the disclosure, the drain is connected to a local bit line connected to a plurality of three dimensional memory cells.

In an aspect of the disclosure, an electronic switching device comprises a first terminal, a second terminal, a third terminal including an inner surface, an oxide layer on the inner surface of the third terminal, and a chalcogenide pillar extending through the oxide layer and the third terminal, the pillar being in electrical communication with the first terminal and the second terminal. The voltage difference between the first terminal and the second terminal changes the channel from a first state to a second state when a threshold voltage between the first terminal and the second terminal is exceeded. In an aspect of the disclosure, the threshold voltage is dependent on temperature.

In an aspect of the disclosure, the third terminal is resistive and receives a control signal to apply heat to the pillar and modulate the threshold voltage.

In an aspect of the disclosure, the vertical pillar includes Ge or Sb.

In an aspect of the disclosure, the vertical pillar includes As or Si.

In an aspect of the disclosure, the vertical pillar includes an element selected from the group consisting of Al, In, Bi, Pb, Sn, P, and O.

In an aspect of the disclosure, the first terminal is connected to a global bit line in a nonvolatile memory.

In an aspect of the disclosure, the second terminal is connected to a local bit line connected to a plurality of three dimensional memory cells.

In an aspect of the disclosure, the first terminal is connected to a global bit line in a nonvolatile memory.

In an aspect of the disclosure, the control signal at the third terminal outputs an electrical field that does not create a conduction channel in the pillar.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1:
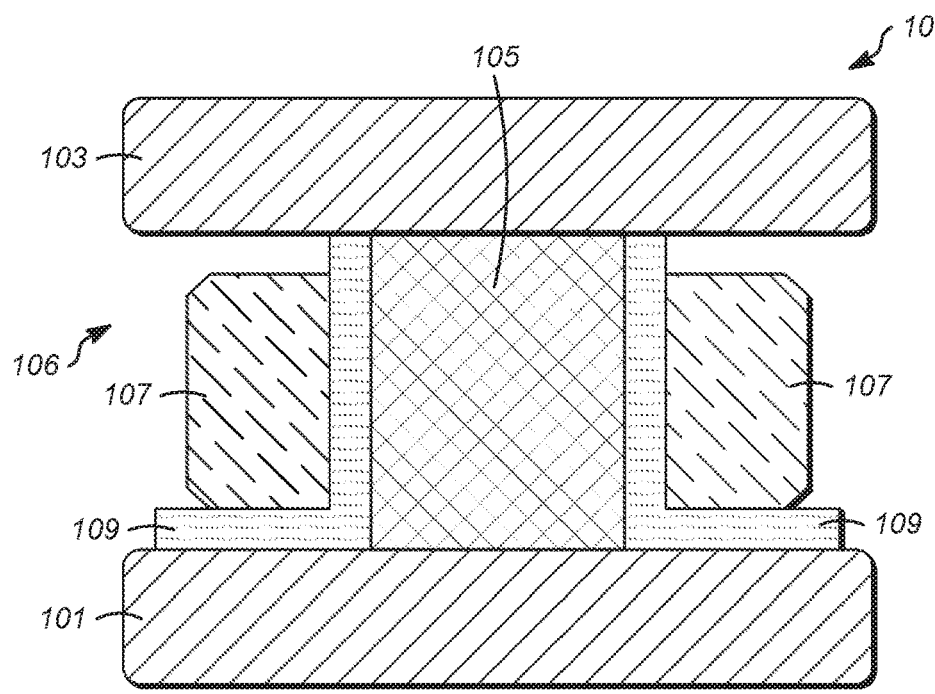
FIG. 1 shows a solid state structure according to an aspect of the present disclosure.

FIG. 1 generally illustrates a solid state structure 100, which can be used as a switch in electronic devices. The solid state structure 100 can be used a switching device for three-dimensional memories. In an example embodiment, the switching device can be a local bitline switch. A first terminal 101 is configured to provide a first electrical signal, e.g., a first voltage. A second terminal 103 is configured to provide a second electrical signal, e.g., a second voltage. The first terminal 101 and the second terminal 103 can be mirror images of each other. The first terminal 101 and the second terminal 103 can be conductive material layers. In an example embodiment, the first terminal 101 and the second terminal 103 include metal. The first terminal 101 and the second terminal 103 can include tungsten (W). The first terminal 101 and the second terminal 103 can be formed using semiconductor fabrication techniques. The first terminal 101, and the second terminal 103 can be connected, e.g., through traces or other conductive lines to controller circuitry, which can provide the electrical signals to the first and second terminals 101, 103. The first terminal 101 can be connected to a global bit line in a nonvolatile memory. The second terminal 103 can be connected to a local bit line connected to a plurality of three dimensional memory cells.

A pillar 105 extends between the first terminal 101 and the second terminal 103. In an example embodiment, the pillar 105 has a first dimension, here shown as vertical, that is greater than the vertical dimensions of the first terminal 101 and the second terminal 103. The pillar 105 has a second dimension, here shown as width, that is less than the dimension of the first and second terminals 101, 103 in the same direction. The pillar 105 can be a chalcogenide material in an example. In a first, nonconductive state, the pillar 105 does not conduct electricity between the first terminal 101 and the second terminal 103. The pillar 105 in the first state includes an amorphous oriented material. In a second, conductive state, the pillar 105 conducts electricity between the first terminal 101 and the second terminal 103. The pillar 105 changes from the first, nonconductive state to the second, conductive state when a voltage across the pillar, between the first terminal 101 and the second terminal 103, meets or exceeds a threshold voltage. The pillar 105 can switch from the second, conductive state to the first, nonconductive state when a current through the pillar drops below a current threshold. In an example, embodiment, the threshold voltage is dependent on temperature.

A thermal control assembly 106 is provided to control, e.g., add, thermal energy to the pillar 105. The addition of thermal energy to the pillar 105 can lower the threshold to change the state of the pillar from non-conducting to conducting. The thermal control assembly 106 includes a third terminal 107 adjacent the pillar 105 and between the first terminal 101 and the second terminal 103. In an example embodiment, the assembly 106 includes an insulation layer 109 intermediate the third terminal 109 and the pillar 105. The insulation layer 109 is positioned on an inner surface of the third terminal 107. The insulation layer 109 separates the pillar 105 from the third terminal 107 in an example embodiment. The insulation layer 109 separates the second terminal 103 from the third terminal 107 in an example embodiment. In an example embodiment, the third terminal 107 and the insulation layer 109 extend completely around the pillar 105. The pillar 105 extends through the insulation layer 109 and the third terminal 107. The pillar 105 is in electrical communication with the first terminal 101 and the second terminal 103. The third terminal 107 can extend along a plurality of adjacent of aligned pillars 105, e.g., in the Y direction of FIG. 3B or FIG. 12.

The pillar 105 can be a chalcogenide material. In an example embodiment, the pillar 105 includes Ge or Sb. In an example embodiment, the pillar 105 includes As, Se or Si. In an example embodiment, the pillar 105 includes an element selected from the group consisting of Al, In, Bi, Pb, Sn, P, and O.

The switch 100 can increase driving current relative to a traditional transistor. The threshold switch 100 when in the ON state has avalanche-type conduction, e.g., has no current limitation.

Figure 2:
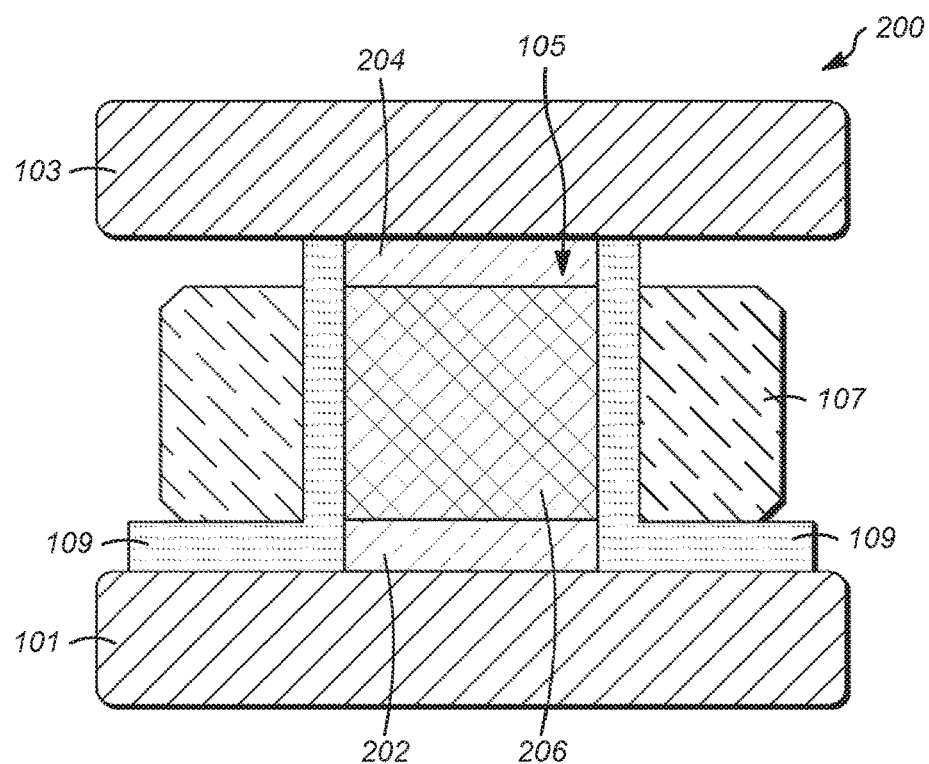
FIG. 2 shows a solid state structure according to an aspect of the present disclosure.

FIG. 2 generally illustrates a solid state structure 200, which can be used as a switch in electronic devices. The structure 200 is similar to the structure 100 with the same elements being designated with the same reference numbers. The vertical pillar 105 includes a first cap 202 intermediate the first terminal 103 and a body 204 of the pillar 105. The vertical pillar 105 includes a second cap 204 intermediate the second terminal 103 and the body 204 of the pillar 105. The caps 202, 204 can be the same material. In an example embodiment, at least one of the caps 202, 204 include carbon. The insulation layer 109 covers the caps 202, 204 to separate and electrically insulate the third terminal 107 from the pillar body 106 and the caps 202, 204.

Figure 3A:
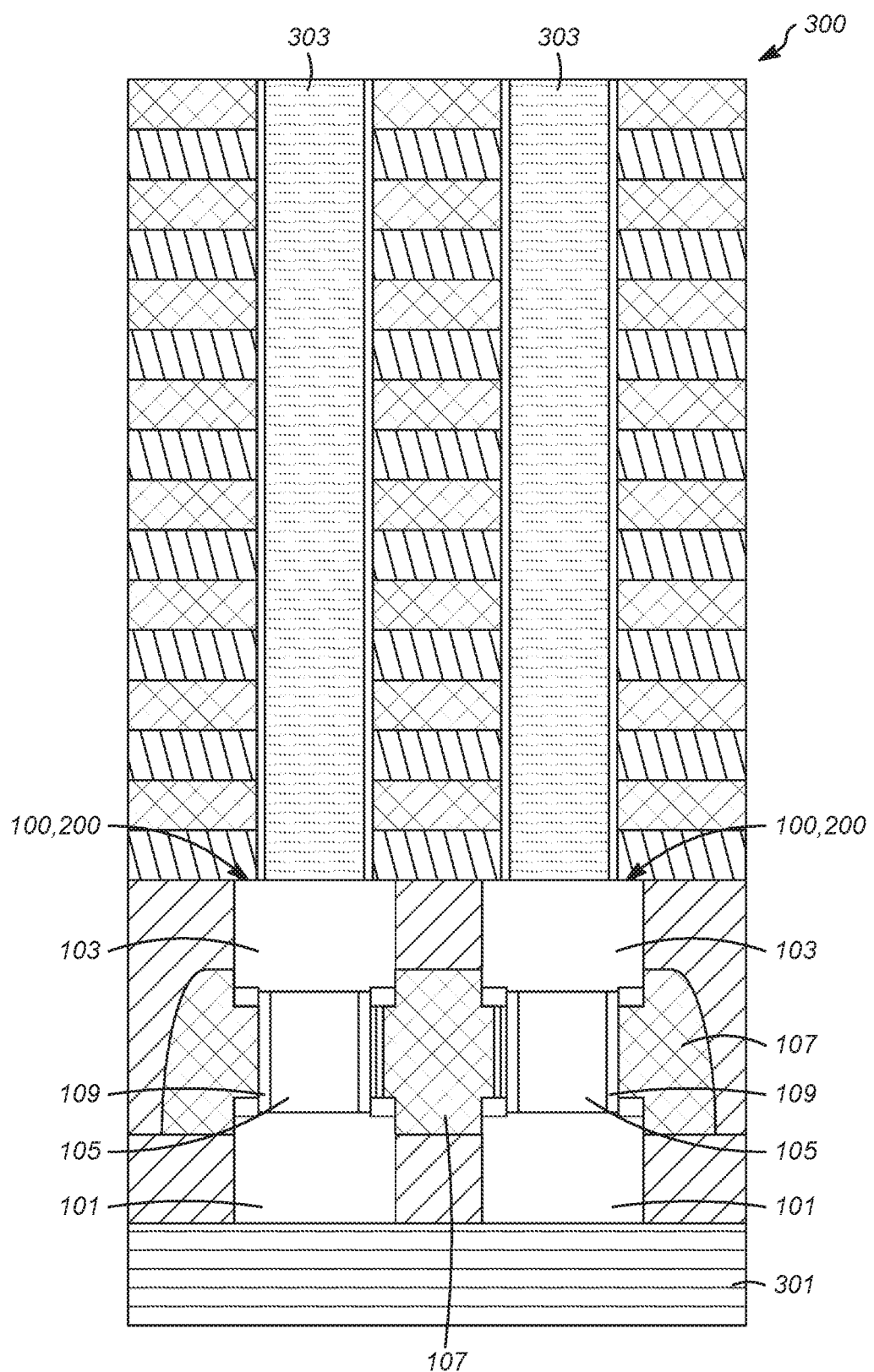
FIG. 3A shows a vertical non-volatile memory structure according to an aspect of the present disclosure.

FIG. 3A illustrates a vertical memory structure 300, which can include a switch 100, 200 as described herein. The first terminal 101 is electrically connected to a global bit line, which is connected to controller circuitry. The second terminal 102 is electrically connected to a local bit line 302, which is connected to controller circuitry. The switch 100, 200 can be switched on based on the voltage difference between the global bit line 301 and the local bit line 302. The memory structure includes a plurality of layers, which can stack insulating layers, a charge storage layer, and a word line layer to access individual memory cells.

Figure 3B:
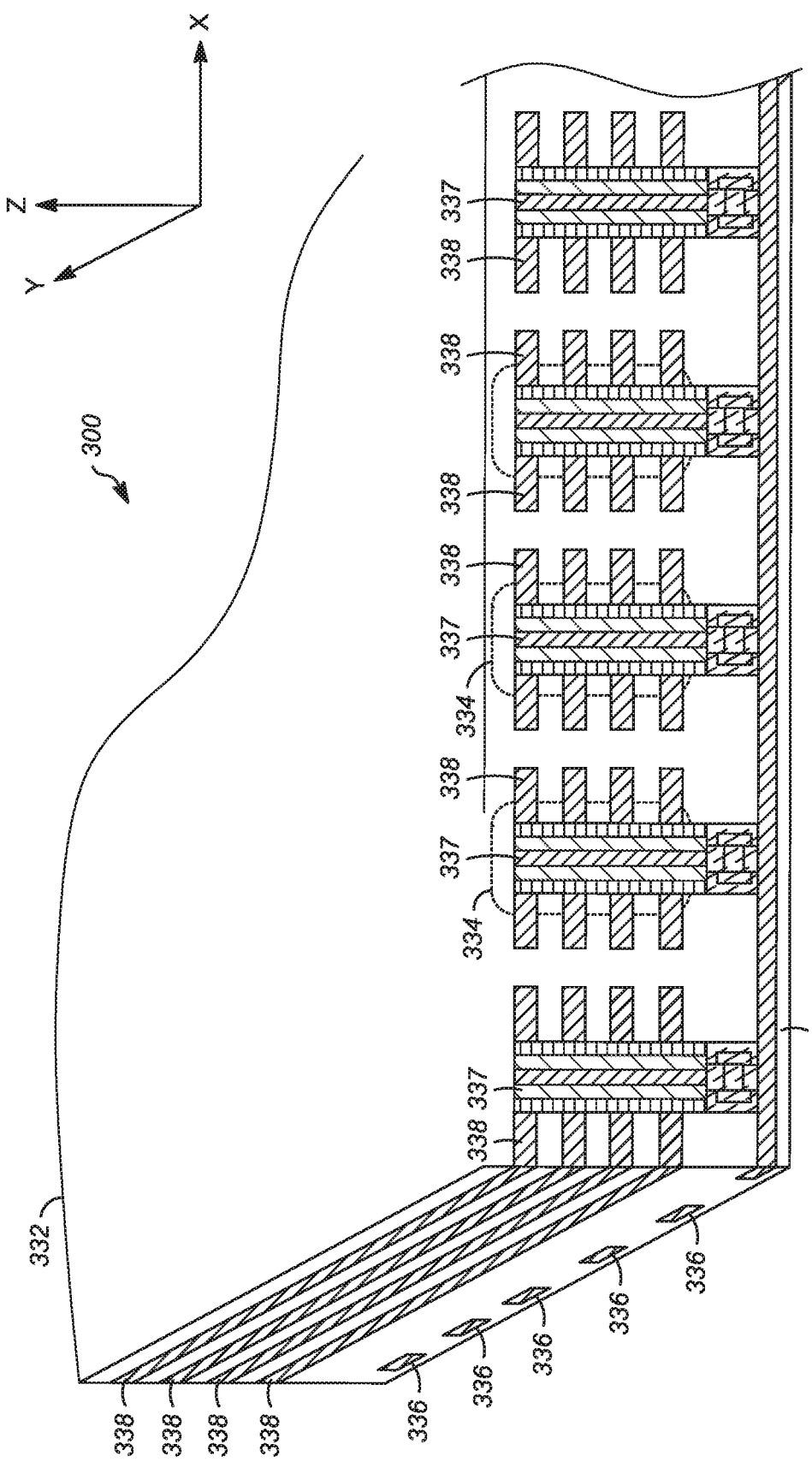
FIG. 3B is a schematic block diagram a memory system utilizing a phase change switch according to an aspect of the present disclosure.

FIG. 3B illustrates a cutaway perspective view of one embodiment of a system 330 for a nonvolatile memory. The system 330, in the depicted embodiment, includes one or more non-volatile memory elements 332, each comprising a substrate 342, a plurality of vertical memory structures 334, a plurality of global bit lines 336, a plurality of word lines 338, and a plurality of switches 340. In this example, the global bit lines 336 extend in the X direction, and the word lines 338 extend in the Y direction, as shown in FIG. 3B. In some examples, the vertical memory structures 334 may be referred to as pillars extending in the Z direction in FIG. 3B and located at the crossings between the global bit lines 336 and word lines 338. Each of the vertical memory structures 334 has a vertical local bit line 337 that is coupled to a corresponding global bit line 336 via a switch 340.

In general, a non-volatile memory (NVM) element 330 comprises a non-volatile memory medium for storing data. The non-volatile memory element 332 may comprise and/or be part of a non-volatile memory device for storing data using an array of vertical three-dimensional (3D) memory structures 334, which may each comprise a plurality of data storage cells, which can be selected using the switch 340. For example, the system 330 may comprise one or more non-volatile memory elements 332, such as one or more chips, packages, dies, die planes, and/or other integrated circuit memory devices (e.g., one or more monolithic, three-dimensional memory devices; semiconductor devices; and/or other solid-state devices) comprising a non-volatile memory medium.

The non-volatile memory element 332 may comprise a substrate 342 or other base or support structure. For example, the substrate 342 may comprise a silicon wafer (e.g., mono-crystal silicon wafer, silicon on sapphire), a gallium arsenide wafer, ceramic, or the like. In certain embodiments, the substrate 342 comprises one or more electrical connections (e.g., one or more pins, pads, leads, contacts, traces, electrically conductive holes, or the like) for the non-volatile memory element 332 to interface with a printed circuit board, packaging, and/or another electrical interface.

Several integrated circuit layers, in certain embodiments, may be deposited or otherwise formed on the substrate 342 to form the non-volatile memory element 332. In the depicted embodiment, the non-volatile memory element 332 includes a plurality of electrically conductive word lines 338 and global bit lines 336, with electrically insulating material between the electrically conductive word lines 338 and bit lines (e.g., between adjacent word lines 338 in the same layer, between word lines 338 in different layers, between global bit lines 336, between local bit lines 337, between word lines 338 and global bit lines 336, and/or between other electrically conductive material of the non-volatile memory element 332). For example, the non-volatile memory element 332 may be formed with alternating layers of conductive material (e.g., metal) and insulating material (e.g., dielectric), or the like, using a masking process, a deposition process, and/or another similar process to form the word lines 338, bit lines 336, and other features and circuitry of the non-volatile memory element 332.

The vertical memory structures 334 (e.g., pillars) comprise a non-volatile memory medium, such as a charge storage memory material or the like, for storing data. In certain embodiments, the vertical memory structures 334 may be formed using an iterative, layered deposition process with the layers of word lines 338 and/or bit lines 336. In a further embodiment, one or more memory holes (e.g., openings or cavities) may be formed in the non-volatile memory element 332 during the fabrication and/or manufacturing process, in which the vertical memory structures 334 may be deposited and/or otherwise formed. For example, memory holes or other openings may be preserved using a masking process (e.g., to prevent the deposition of electrically conductive material or electrically insulating material). Memory holes or other openings may be drilled, cut, etched, and/or otherwise formed after the layers of electrically conductive material and electrically insulating material have been deposited, or the like.

The vertical memory structures 334, in certain embodiments, are deposited or otherwise formed in memory holes or other openings in the layers of electrically conductive material and electrically insulating material on the substrate 342. Non-volatile memory cells, in one embodiment, are formed at the intersection of the word lines 338 and local bit lines 337. The vertical memory structures 334 form a three-dimensional (3D) array of non-volatile memory cells.

In one embodiment, a non-volatile memory medium of the vertical memory structures 334 (e.g., a resistive memory material or the like) and/or one or more other layers (e.g., a separation layer, a selector layer, a central bit line layer, or the like) may be deposited in a memory hole or other opening using an atomic layer deposition (ALD) process and/or another thin film or chemical vapor deposition (CVD) process. For example, a sequence of precursor chemicals (e.g., alternate gaseous species, or the like) may be exposed to a surface of the memory hole or other opening, which acts as a substrate upon which the intended layer is grown (e.g., a layer of phase change material or other non-volatile memory medium, a separation layer of carbon and/or an oxide, a selector layer of a different phase change material, a metallic central bit line layer, or the like). In one embodiment, multiple precursors may be used simultaneously. In another embodiment, different precursors may be inserted in a series of sequential, non-overlapping pulses, or the like. In certain embodiments, the precursor molecules react with the surface in a self-limiting way, so that the reaction terminates once all the reactive sites on the surface are consumed (e.g., an ALD cycle). In other embodiments, a direct liquid injection (DLI) vaporizer deposition process may be used, a physical vapor deposition (PVD) process may be used, or the like.

The vertical memory structures 334, in one embodiment, comprise multiple layers, such as a conductive bit line layer (e.g., a local bit line, a central bit line, a vertical bit line, or the like), a non-volatile memory medium layer (e.g., a resistive memory material layer, or the like), a selector layer, and/or another layer. In one embodiment, the selector layer may include an ovonic threshold-type switch material layer or the like. In the depicted embodiment, each vertical memory structure 334 may include a central, vertical, electrically conductive bit line, with a resistive memory material disposed on at least two sides of the bit line (e.g., on two opposite sides of the bit line; surrounding the bit line; or the like) as a non-volatile memory medium. One or more word lines 338, in the depicted embodiment, are in electrical communication with (e.g., in contact with) a selector layer (e.g., an ovonic threshold switch material), forming one or more memory cells between each word line 108 and an associated bit line.

The selector layer, in certain embodiments, may reduce and/or eliminate sneak path currents (leakage currents) that may cause disturb effects and/or higher currents, allowing for a larger memory array size (e.g., more memory cells and layers) than would be possible without the selectors. As used herein, a selector comprises a non-linear element (NLE) and/or a switching element in electrical communication with a non-volatile memory medium to provide electrical selectivity of different memory cells of the non-volatile memory medium. The selector can be the switch 100, 200.

In one embodiment, a selector comprises an ovonic threshold switch (OTS) 100, 200 or a non-linear volatile switch 100, 200, 340 that may be formed of a phase change material. An ovonic threshold switch 100, 200, 340 may comprise a two-terminal symmetrical, voltage sensitive, switching device comprising a chalcogenide and/or other phase change material, with at least a blocking state (non-conducting or high resistance) and a conducting state (low resistance), or the like. In response to a voltage potential between a word line 338 and a bit line exceeding a threshold voltage of the OTS selector for a corresponding non-volatile memory cell, the OTS becomes conductive, selecting the non-volatile memory cell and conducting electric current to the non-volatile memory cell. The OTS is symmetrical in the sense that it has substantially similar resistance or conductivity when current flows through the two terminals in different directions (e.g., forward and reverse directions). In some examples, the difference in resistance between the forward and reverse directions may be 5 percent or less.

A threshold switch 100, 200, 340 in various embodiments, may comprise a chalcogenide material (e.g., an ovonic threshold switching material) such as AsTeGeSi, AsTeGeSiN, GeTe, GeSe, SiTe, ZnTe, GeTeSbAs, GeSbTe, and/or one or more other combinations of these elements (e.g., other combinations of As, Te, Ge, Si, N, Se, Zn, or the like). In various embodiments, the switch 100, 200, 340 may be made of a material that is different from the non-volatile memory medium of a memory cell. A chalcogenide material used for a selector (e.g., an ovonic threshold switching material), in one embodiment, has a higher melting point and/or phase change point than a melting point and/or phase change point of a phase change material used as a non-volatile memory medium of a memory cell. In this manner, in certain embodiments, the selector maintains its properties (e.g., resistance or conductivity) and does not change states or phases during normal operation (e.g., typical temperatures, voltages, and/or currents) of the non-volatile memory element 332, even when the non-volatile memory medium changes states or resistance. The switch when implemented with an OTS material has characteristics (e.g., bidirectional threshold-type switching, symmetry switching, and non-linear switching) that are not available in other types of selectors such as a poly junction selector (e.g., a Si PN junction or the like), an oxide junction selector (e.g., an Ox PN junction or the like), an oxide rectifier, a mixed-ionic-electronic-conduction (MIEC) based selector (e.g., Cu+ in SE or the like), a metal-insulator-metal (MIM) junction, a metal-insulator-semiconductor (MIS) junction, a metal-semiconductor (MS) Schottky junction, or the like.

In the depicted embodiment, the non-volatile memory and the switch are connected in series between a word line 338 and a bit line 336, and may be directly formed next to each other. In some embodiments, a conductive intermediate layer or electrode may be formed between the resistive memory material and the switch. In some embodiments, the relative positions of the switch and the non-volatile memory may be reversed between the corresponding word line and bit line. For example, the switch may be directly connected to the bit line, and the non-volatile memory may be directly connected to the word line.

The non-volatile memory element 332 may comprise PCM, Memristor memory, programmable metallization cell memory, phase-change memory, NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), or the like. The non-volatile memory medium of the non-volatile memory element 332, in certain embodiments, may comprise a storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other legacy technologies. For example, storage class memory may comprise one or more non-volatile memory elements 332 of phase-change memory, ReRAM, Memristor memory, programmable metallization cell memory, nano RAM, nanocrystal wire-based memory, silicon-oxide based sub-10 nanometer process memory, graphene memory, SONOS memory, PMC memory, CBRAM, MRAM, and/or variations thereof.

In the depicted embodiment, each vertically oriented 3D resistive memory element comprises memory cells at the cross-points of the word lines 108 and bit lines 106 (e.g., the horizontal global bit lines 336; the vertical, central, and/or local bit lines within a vertical memory structure 334; or the like). In this manner, several memory cells (e.g., two memory cells, four memory cells, eight memory cells, sixteen memory cells, thirty-two memory cells, sixty-four memory cells, or the like) may be implemented by a single continuous layer of material (e.g., phase change material). For example, in the depicted embodiment, strips of resistive memory material or other non-volatile memory material are oriented vertically along opposite sides of the vertical memory structure 334, with four word lines 338 on each opposite side as well to form the memory cells. In certain embodiments, word lines 338 and strips of insulating material under them in a group of planes may be defined simultaneously by use of a single mask, thus simplifying the manufacturing process.

In an example embodiment, planes comprising the word lines 338 have substantially the same horizontal pattern of conductive, insulating, and resistive memory materials. In each plane, electrically conductive (e.g., metal) word lines 338 (e.g., WLzx) are elongated in a first direction and spaced apart in a second direction. Each plane includes a layer of insulating material (e.g., a dielectric) that isolates the plane's word lines 338 from the word lines 338 of the plane below it and/or of the substrate 342 circuit components below it. In some embodiments, the word lines 338 WLzx for a fixed value of x form a stack of alternating layers that may extend beyond the memory element 342 into a contact area (not shown), or the like.

Extending through each plane, in the depicted embodiment, is an array of electrically conductive (e.g., metal) local bit line (LBL) "pillars" within each vertical memory structure 334 (e.g., a central, vertical bit line), elongated in the vertical direction, perpendicular to the word lines 338. Each vertical memory structure 334 (e.g., through the associated internal local bit line pillar) is connected to one of a set of underlying global bit lines (GBL) 336 (e.g., located in the silicon substrate 342) running horizontally (e.g., in a parallel plane to the word lines 338, but elongated in a different, perpendicular direction than the word lines 338), at the same pitch as a pillar spacing of the vertical memory structures 334, connected through the switch devices 100, 200, 330. The switch devices 330 selectively place the global bit lines 336 in electric communication with the vertical, central, local bit lines within the vertical memory structures 334. The switch devices 100, 200, 330 may be formed in or on the substrate 342. The switch devices 100, 200, 342 may have gates driven by row select lines (SG) (e.g., also formed in the substrate or the like). Also fabricated in or on the substrate 342, in certain embodiments, may be sense amplifiers, input-output (I/O) circuitry, control circuitry, and/or other peripheral circuitry. There may be one row select line (SG) for each row of vertical memory structures 334 (e.g., pillars) and one select device (Q) for each individual local bit line (LBL) within each vertical memory structure 334.

Figure 4:
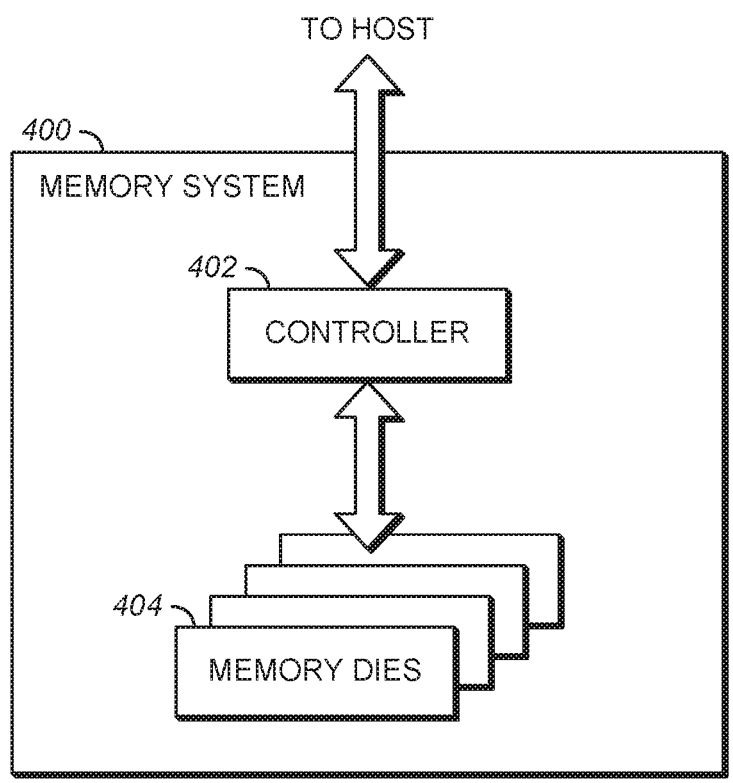
FIG. 4 generally illustrates a block diagram of an example memory system according to an aspect of the present disclosure.

FIG. 4 generally illustrates a block diagram illustrating a memory system 400. The memory system 400 may include a controller 402 and memory that may include or be made up of one or more memory dies 404. As used herein, the term die refers to the set of memory cells, and associated circuitry for managing the physical operation of those memory cells, that are formed on a single semiconductor substrate. The controller 402 may interface with a host system and transmit command sequences for read, program, and erase operations to the non-memory die(s) 404.

The controller 402 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 402 can be configured with hardware and/or firmware to perform the various functions described below and generally illustrated in the flow diagrams. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 402 is a device that manages data stored in the memory die(s) and communicates with a host, such as a computer or electronic device. The controller 402 can have various functionality in addition to the specific functionality described herein. For example, the controller 402 can format the memory dies 404 to ensure the memory dies 404 are operating properly, map out bad flash memory cells, and allocate spare cells to be substituted for future failed cells. Some part of the spare cells can be used to hold firmware to operate the controller 402 and implement other features. In operation, when a host needs to read data from or write data to the memory die(s) 404, the host will communicate with the controller 402. If the host provides a logical address to which data is to be read/written, the controller 402 can convert the logical address received from the host to a physical address in the memory die(s) 404. (Alternatively, the host can provide the physical address). The controller 402 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The memory die 404 includes the switches 100, 200 described herein.

The interface between the controller 402 and the non-volatile memory die(s) 404 may be any suitable interface, such as flash interface, including those configured for Toggle Mode 200, 400, 800, 1000 or higher. For some example embodiments, the memory system 400 may be a card based system, such as a secure digital (SD) or a micro secure digital (micro-SD) card. In alternate example embodiments, the memory system 400 may be part of an embedded memory system.

In the example illustrated in FIG. 4, the memory system 400 is generally illustrated as including a single channel between the controller 402 and the non-volatile memory die(s) 404. However, the subject matter described herein is not limited to memory systems having a single memory channel. For example, in some memory systems, such as those embodying NAND architectures, 2, 4, 8 or more channels may exist between the controller 402 and the memory die(s) 404, depending on controller capabilities. In any of the embodiments described herein, more than a single channel may exist between the controller and the memory die(s) 404, even if a single channel is shown in the drawings.

Figure 5:
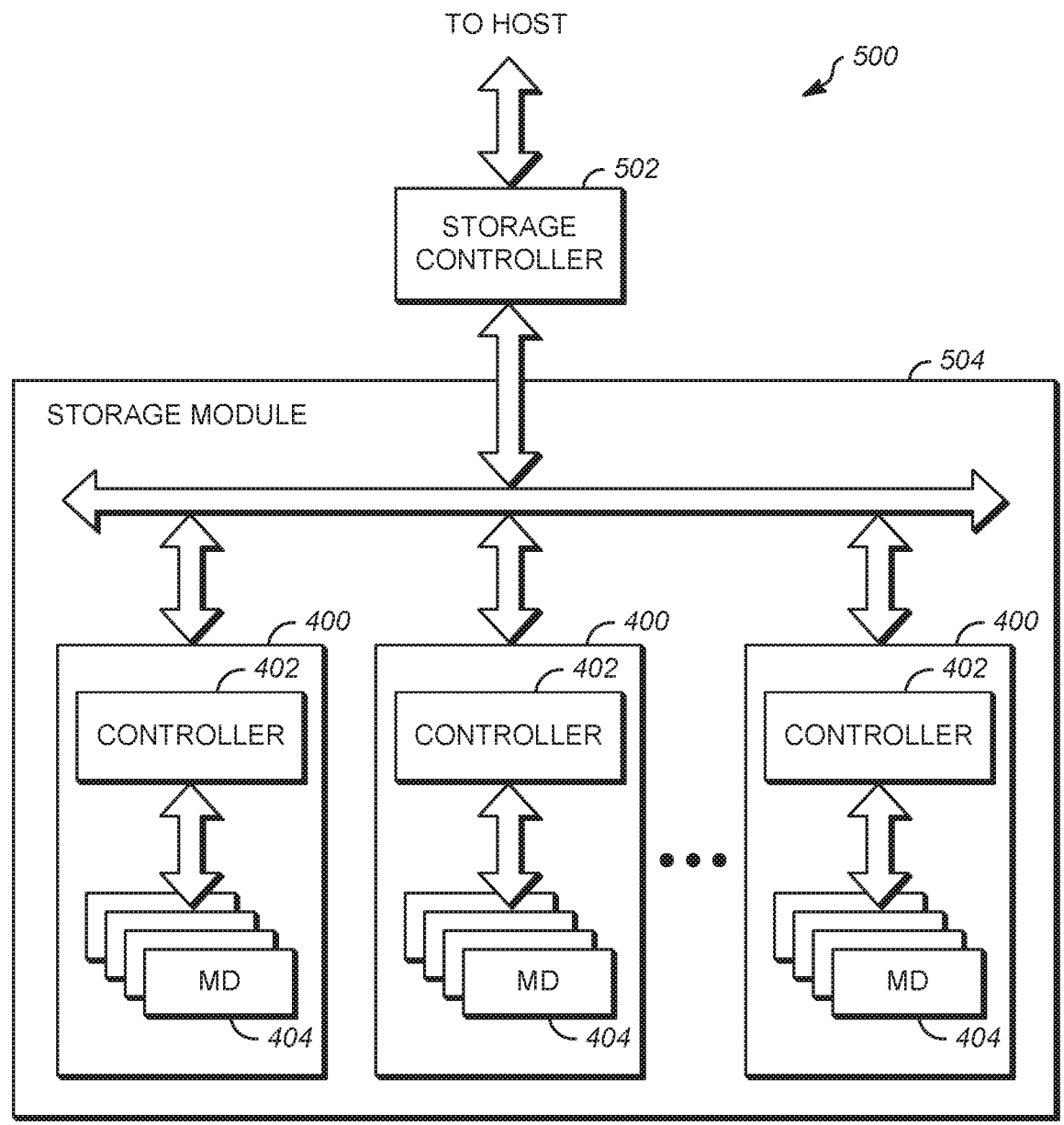
FIG. 5 generally illustrates a block diagram of an example storage module that includes a plurality of memory systems according to an aspect of the present disclosure.

FIG. 5 illustrates a storage module 500 that includes a plurality of non-volatile memory systems 400. As such, the storage module 500 may include a storage controller 502 that interfaces with a host and with a storage system 504, which includes a plurality of non-volatile memory systems 400. The interface between the storage controller 502 and non-volatile memory systems 400 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 500, in one embodiment, may be a solid state drive (SSD), such as found in portable computing devices, such as laptop computers and tablet computers, and mobile phones.

Figure 6:
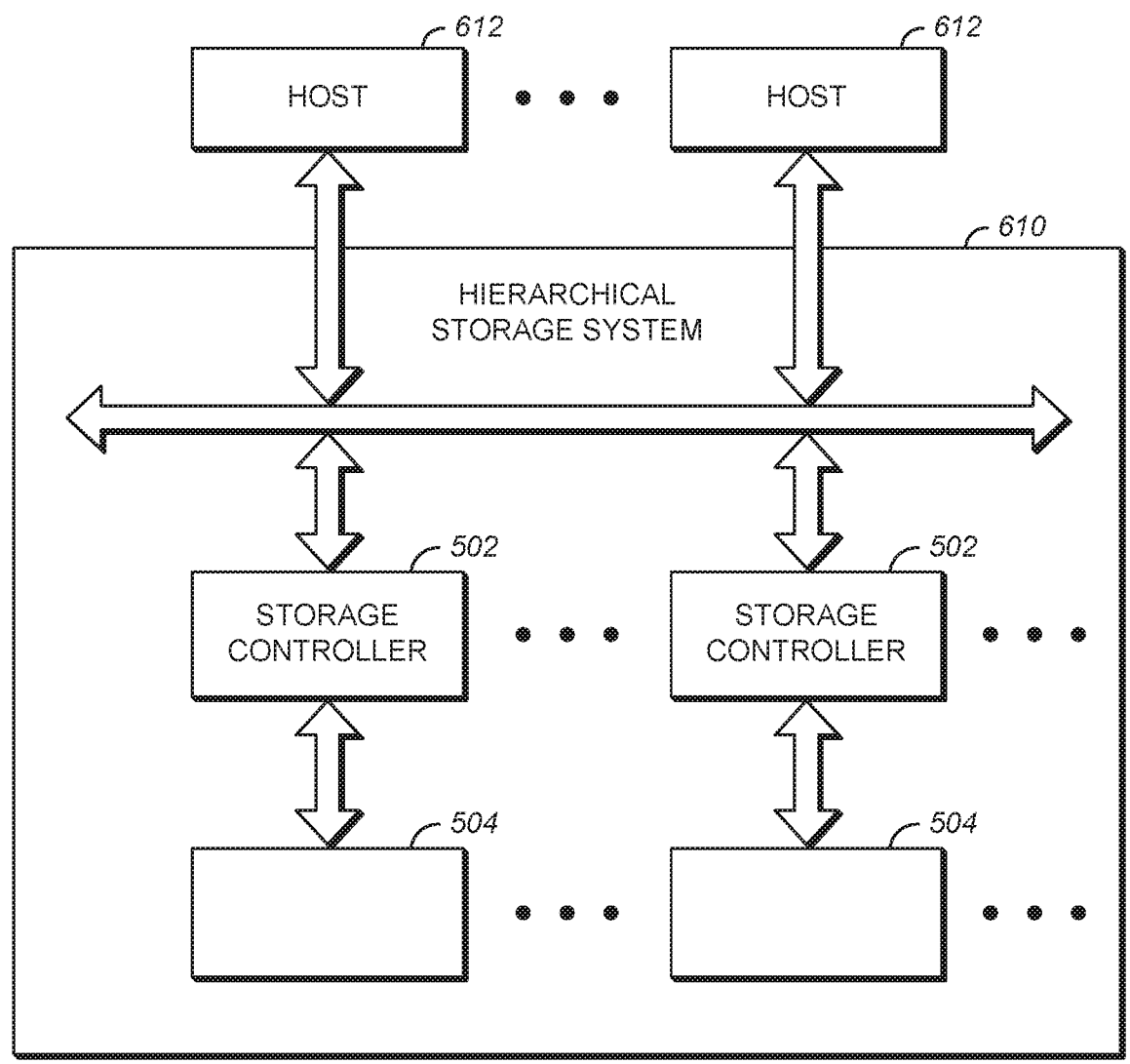
FIG. 6 generally illustrates a block diagram of an example hierarchical storage system.

FIG. 6 is a block diagram illustrating a hierarchical storage system 610. The hierarchical storage system 610 may include a plurality of storage controllers 502, each of which control a respective storage system 504. Host systems 612 may access memories within the hierarchical storage system 610 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 610 illustrated in FIG. 6 may be a rack mountable mass storage system that is accessible by multiple host computers, such as would be found in a data center or other location where mass storage is needed.

Figure 7:
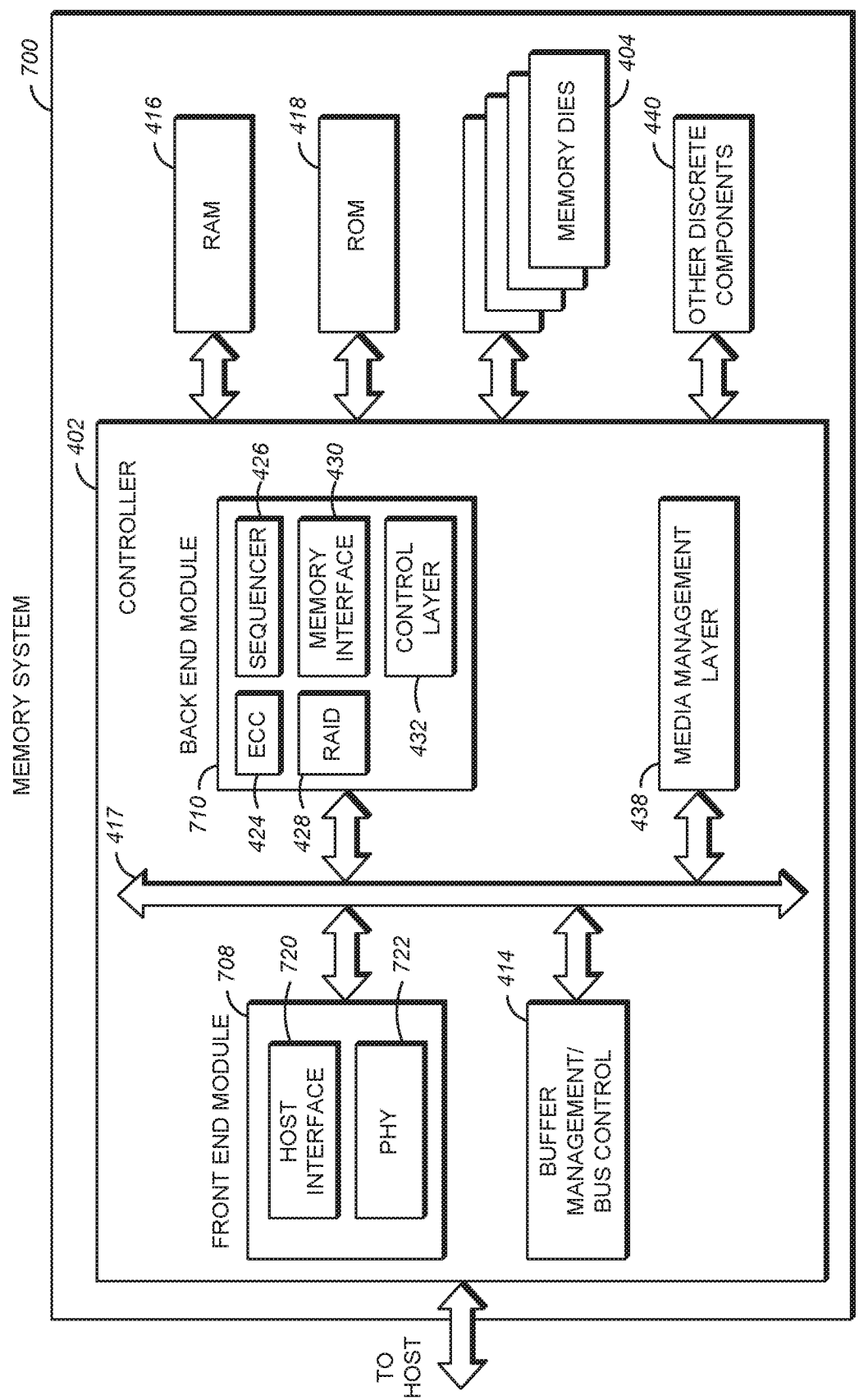
FIG. 7 generally illustrates a block diagram of an example configuration of components of a controller of the memory system of FIG. 4 according to an aspect of the present disclosure.

FIG. 7 is a block diagram illustrating exemplary components of the controller 402 in more detail. The controller 402 may include a front end module 708 that interfaces with a host, a back end module 710 that interfaces with the non-volatile memory die(s) 404, and various other modules that perform various functions of the non-volatile memory system 700. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 402 may include a buffer manager/bus controller module 414 that manages buffers in random access memory (RAM) 416 and controls the internal bus arbitration for communication on an internal communications bus 417 of the controller 402. A read only memory (ROM) 418 may store and/or access system boot code. Although illustrated in FIG. 6 as located separately from the controller 402, in other embodiments one or both of the RAM 416 and the ROM 418 may be located within the controller 402. In yet other embodiments, portions of RAM 416 and ROM 418 may be located both within the controller 402 and outside the controller 402. Further, in some implementations, the controller 402, the RAM 416, and the ROM 418 may be located on separate semiconductor dies.

Additionally, or alternatively, the front-end module 708 may include a host interface 720 and a physical layer interface (PHY) 722 that provide the electrical interface with the host or next level storage controller. The choice of the type of the host interface 720 can depend on the type of memory being used. Example types of the host interface 720 may include, but are not limited to, SATA, SATA Express, SAS, Fibre Channel, USB, PCIe, and NVMe. The host interface 720 may typically facilitate transfer for data, control signals, and timing signals.

The back end module 710 may include an error correction code (ECC) engine or module 424 that encodes the data bytes received from the host, and decodes and error corrects the data bytes read from the non-volatile memory die(s) 404. The back end module 710 may also include a command sequencer 426 that generates command sequences, such as program, read, and erase command sequences, to be transmitted to the non-volatile memory die(s) 404. Additionally, or alternatively, the back end module 710 may include a RAID (Redundant Array of Independent Drives) module 728 that manages generation of RAID parity and recovery of failed data. The RAID parity may be used as an additional level of integrity protection for the data being written into the non-volatile memory system 700. In some cases, the RAID module 428 may be a part of the ECC engine 424. A memory interface 430 provides the command sequences to the non-volatile memory die(s) 404 and receives status information from the non-volatile memory die(s) 404. Along with the command sequences and status information, data to be programmed into and read from the non-volatile memory die(s) 404 may be communicated through the memory interface 430. In one embodiment, the memory interface 430 may be a double data rate (DDR) interface and/or a Toggle Mode 200, 400, 800, or higher interface. A control layer 432 may control the overall operation of back end module 710.

Additional modules of the non-volatile memory system 700 illustrated in FIG. 7 may include a media management layer 438 that performs certain memory management functions such as wear leveling of memory cells of the memory dies 404, address management, and facilitates folding operations. Other memory management functions may be possible. The non-volatile memory system 400 may also include other discrete components 440, such as external electrical interfaces, external RAM, resistors, capacitors, or other components that may interface with the controller 402. In alternative embodiments, one or more of the RAID module 428, media management layer 438 and buffer management/ bus controller 414 are optional components that may not be necessary in the controller 402.

Figure 8:
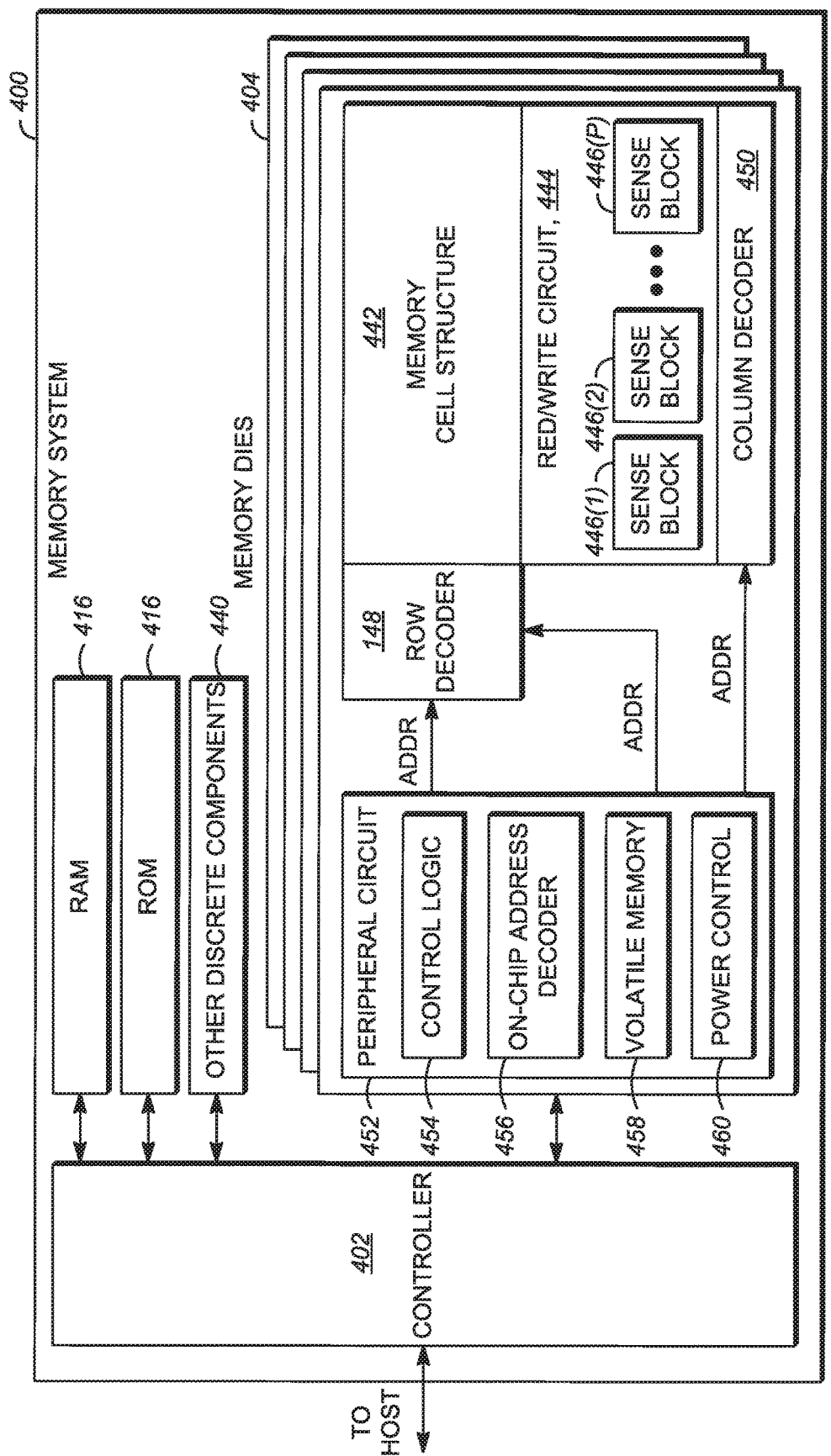
FIG. 8 generally illustrates a block diagram of an example configuration of components of a memory die of the memory system of FIG. 4 according to an aspect of the present disclosure.

FIG. 8 is a block diagram of an example configuration of components of a memory die 404 in more detail. The memory die 404 may include a memory cell structure 442 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 442. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 442 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 442, or at least a portion of the memory cell structure 442, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 9:
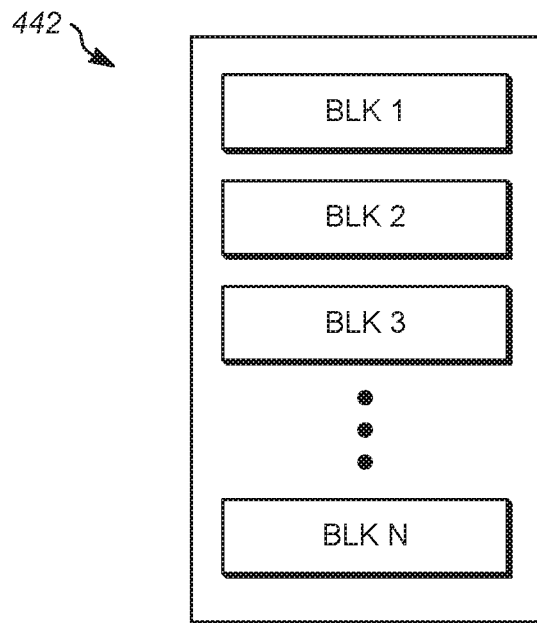
FIG. 9 generally illustrates a block diagram of a memory cell structure organized into blocks according to an aspect of the present disclosure.

Referring to FIG. 9, the memory cells of the memory cell structure 442 located on a single memory die 404 may be organized into an N-number of blocks, extending from a first block BLK 1 to an Nth block BLK N. A block is a minimum unit of erase of a memory die 404. Memory cells that are part of the same block are erased at the same time and/or as part of a same erase operation.

Figure 10:
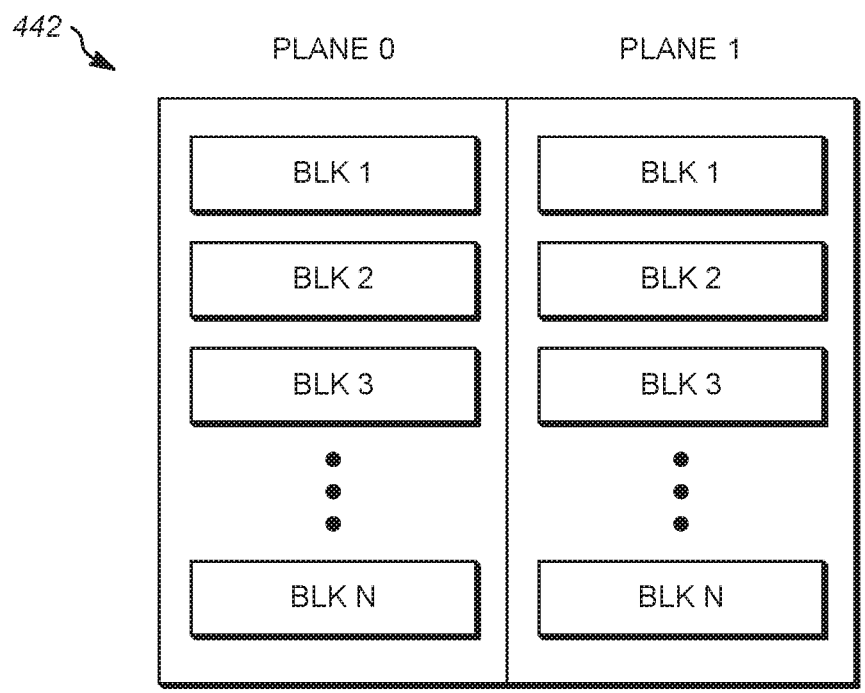
FIG. 10 generally illustrates a block diagram of a memory cell structure organized into blocks in different memory planes according to an aspect of the present disclosure.

Referring to FIG. 10, for some example configurations, the N-number of blocks located on a single memory die 404 are organized into a plurality of memory planes (or just planes). FIG. 10 generally illustrates an example configuration where the blocks are organized into two memory planes, including a first memory plane, Plane 0, and a second memory plane, Plane 1. Configurations that include more than two memory planes may be possible. In FIG. 10, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible. The memory planes include a plurality of the switches 100, 200.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally. Each vertical stack of memory cells are controlled at least in part by the switches 100, 200.

Figure 12:
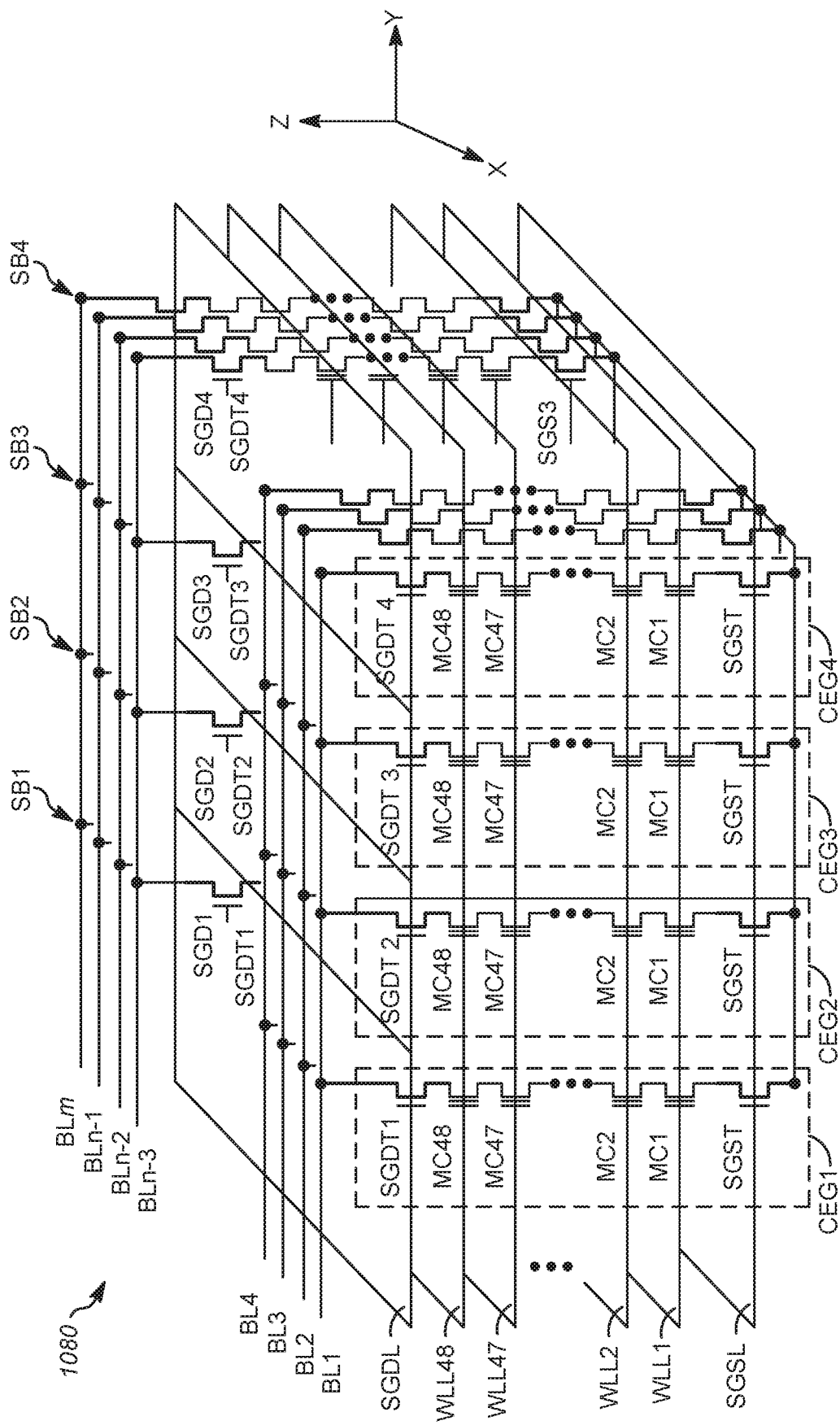
FIG. 12 generally illustrates a circuit schematic diagram of a block of memory cells three-dimensionally arranged into a plurality of NAND strings.

FIG. 12 generally illustrates a perspective view of at least a portion of a memory die 404 that includes a set or a plurality of three-dimensional blocks 400, which may represent at least a portion of the memory cell structure 442 of FIG. 8. For simplicity, the plurality of blocks 400 is generally illustrates as including four blocks, BLK1, BLK2, BLK3, and BLK4. In actual implementation, a given memory cell structure 442 of a memory die 404 may include several more blocks than four, such as on the order of hundreds, thousands, or tens of thousands of blocks. In a particular example configuration, one plane of blocks includes 2,000 blocks, each with a plurality of switches 100, 200.

The blocks 400 are located or disposed on a substrate 402 of the memory die 404. The substrate 402 may be part of a lower level or region 404 of the memory die 404 that carries or includes circuitry under the blocks 400, along with one or more lower metal layers patterned to form conductive paths that carry or supply signals or voltages output from the circuitry, such as those used to perform memory operations (read, program, sense, erase, e.g.). The lower metal layers may be connected to a terminal 101 of the switch 100, 200.

The blocks 400 are disposed in an intermediate level or region 406 (also referred to as a block level or region, or an array level or region) of the memory die 404 in between the lower region 404 and an upper level or region 408 of the memory die 404. The upper region 408 may include one, more upper metal layers patterned in the form of conductive paths that carry or supply signals, or voltages output from the circuitry.

The substrate 402 is generally a planar structure having opposing planar surfaces. Herein, the components on a memory die 404 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 404 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 404 along or with reference to the z-axis. For example, the blocks 400 are "above" the substrate 402, and the substrate 402 is part of the lower region 404 that is "below" the blocks 400. In addition, the upper region 408 is a region of the memory die 404 "above" both the blocks 400 and the substrate 402. Components of the memory die 404 disposed in the upper region 408 are farther away in the z-direction from the substrate 402 than components of the blocks 400. In general, for two components on a given memory die 404, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 404 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 404 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 404, they should not be construed as limiting the relative positioning of the components since a memory die 404, or the memory system 400 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out. The bias can be applied to the switch 100, 200 to move the switch to a conductive state.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible. In an example embodiment, the SGST transistors are the switches 100, 200. In an example embodiment, the SGS transistors are the switches 100, 200.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A control gate line (at least for NAND technology) is a control line that applies a control signal to one or more third terminals to control thermal energy applied to the pillar to reduce the threshold to change the ovonic switch 100, 200 to a conductive state.

A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below. The bit lines can connect to one or more of the terminals 101, 103 of the switch 100, 200.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Additionally, or alternatively, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types), e.g., the third terminals in the switch 100, 200. In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, or alternatively, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Additionally, or alternatively, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 11:
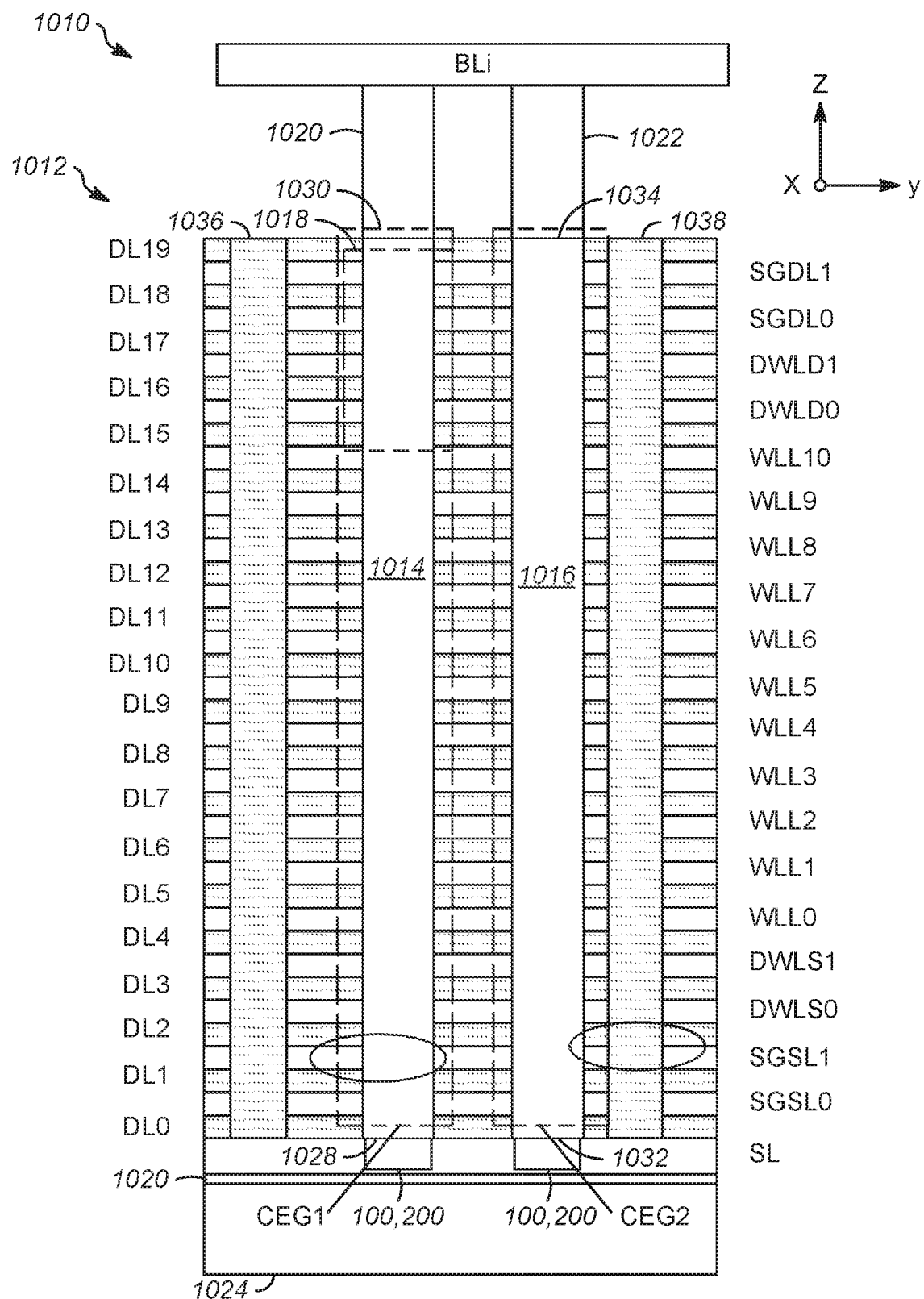
FIG. 11 generally illustrates a cross-sectional view of a portion of a memory according to an aspect of the disclosure.

In further detail, FIG. 11 generally illustrates a cross-sectional view of a portion of a block 1010, which may be representative of one of the blocks 400 of FIG. 9 or 10. The block 1010 includes a stack 1012 of alternating control gate layers and dielectric layers (DL). In addition, the portion generally illustrated in FIG. 12 includes two channels (or memory holes) extending through the layers, including a first channel 1014 and a second channel 1016. Bias elements forming two memory channel element groups around the two channels 1014, 1016 are identified by dotted boxes in FIG. 12. In particular, bias elements forming a first channel element group CEG1 around the first channel 1014 are identified by a dotted box labeled CEG1, and bias elements forming a second channel element group CEG2 around the second memory hole 1016 are identified by a dotted box labeled CEG2. Further details of bias elements and example materials to form the elements and the channels are described in further detail below with respect to FIG. 13 with reference to a particular region 418 of the first channel element group CEG1 and associated first channel 414.

For purposes of illustration, in FIG. 11, the first and second channel element groups CEG1, CEG2 formed around the first and second channels 1014, 1016 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other. The switches 100, 200 are positioned at the bottom of each group.

In addition, a given channel element group may be electrically connected to a given bit line by way of its associated channel and a conductive via electrically connecting the associated channel with the bit line. For example, in FIG. 11, the first channel element group CEG1 is electrically connected to the ith bit line BLi by way of the first channel 1014 and a conductive via 1020 that electrically connects the first channel 1014 with the ith bit line BLi. The second channel element group CEG2 is electrically connected to the ith bit line BLi by way of the second channel 1016 and a conductive via 1022 that electrically connects the second channel 1016 with the ith bit line BLi. Other ways of electrically connecting bit lines with channel element groups may be possible.

The block 1010 may further include or be disposed on a substrate 1024. An insulating film 1026 may be formed on the substrate 1024, and a source line SL may be formed or disposed on a bottom-most layer of the stack 1012.

In addition, in the example configuration illustrated in FIG. 11, each channel 414, 416 includes a source end connected to the source line SL, and a drain end connected to its associated conductive via. In FIG. 13, the first channel 1014 includes a source end 1028 connected to the source line SL, and a drain end 1030 connected to the conductive via 1020. Similarly, the second channel 1016 includes a source end 1032 connected to the source line SL, and a drain end 1034 connected to the conductive via 1022.

In addition, at least some example configurations, the block 1010 may further include vertical interconnects (e.g., metal-filled slits) extending through the stack 1012 that connect the source line SL to a conductive line above the stack 1012, such as a conductive line in one of the metal layers in the upper region 1008. For purposes of illustration, FIG. 11 generally illustrates two interconnects 1036, 1038 extending through the stack 1012.

In addition, in the example configuration in FIG. 11, for purposes of illustration, each of the channel element groups include two SGS transistors, two source-side dummy cells, eleven memory cells, two drain-side dummy cells, and two SGD transistors. Accordingly, the control gate layers of the stack 1012 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDL1. The stack further includes twenty dielectric layers, extending from a first dielectric layer DL0 to a twentieth dielectric layer DL19, alternatingly disposed between the control gate layers.

The numbers of bias elements and their respective bias element types used for the channel element groups and the number of corresponding control gate layers in the example configuration of the block 1010 in FIG. 11 are non-limiting and merely exemplary for purposes of illustration. Other numbers of bias elements for any of the bias element types, or other configurations that do not include bias elements of certain bias elements types or that include one or more bias elements of bias element types other than those illustrated in FIG. 11, may be possible.

FIG. 12 generally illustrates a circuit schematic diagram of an example configuration of a three-dimensional block 1080, which may be representative of at least a portion of one of the blocks 400 of FIG. 9 and/or have the physical construction or structure as depicted in other figures. In FIG. 12, each bias element is represented or depicted as a transistor. In addition, memory cells are labeled MC, SGD transistors are labeled SGDT, and SGS transistors are labeled SGST. In the example block 1080, each channel element group includes 50 cells, including 48 memory cells, extending from a first memory cell MC1 to a 48th memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described. Any of the transistors SGD, SGDT, SGS or SGST can be replaced with a switch 100, 200.

In accordance with the channel element group configuration in FIG. 12, the block 1080 includes fifty control gate layers, including forty-eight word line layers extending from a first word line layer WLL1 to a 48th word line layer WLL48, a SGD layer SGDL, and a SGS layer SGSL. As previously described, the ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the 48th memory cells MC48 of the channel element groups CEG are disposed in and configured to have their control gates biased by the 48th word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

The channel element groups CEG and their associated channels are two-dimensionally arranged in the x and y directions in the block 1080, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

In the example configuration of FIG. 14, each bit line BL is configured to electrically connected to four channel element groups (i.e., P=4). Accordingly, FIG. 14 generally illustrates the first bit line BL1 electrically connected to each of a first channel element group CEG1, a second channel element group CEG2, a third channel element group CEG3, and a fourth channel element group CEG4. Each of the other two through mth bit lines BL2 to BLm are also electrically connected to a respective set of four channel element groups and their respective channels. Numbers for P other than four may be possible for various other configurations.

In some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled and/or supplied with the same SGD line voltage such that SGD transistors of the same channel element group have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

In addition, for at least some example configurations of a 3-D block, the number of SGD lines is equal to the P-number of channel element groups and associated channels that are connected to the same bit line. For example, with reference to FIG. 14, the block 480 includes four SGD lines corresponding to the four channel element groups connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the channel element groups may be arranged so that for a given set of channel element groups connected to the same bit line, each channel element group of the set has its SGD transistor SGDT coupled to a different one of the SGD lines. For example, in the block 480 of FIG. 1D, the set of four channel element groups CEG1, CEG2, CEG3, CEG4 connected to the first bit line BL1 have their respective SGD transistors connected to a different one the SGD lines SGD1, SGD2, SGD3, SGD4. In particular, the first channel element group CEG1 includes an SGD transistor SGDT1 coupled to and configured to have its control gate biased by the first SGD line SGD1, the second channel element group CEG2 includes an SGD transistor SGDT2 coupled to and configured to have its control gate biased by the second SGD line SGD2, the third channel element group CEG3 includes an SGD transistor SGDT3 coupled to and configured to have its control gate biased by the third SGD line SGD3, and the fourth channel element group CEG4 includes an SGD transistor SGDT4 coupled to and configured to have its control gate biased by the fourth SGD line SGD4.

A 3-D block may be arranged, organized, or divided into sub-blocks across the m-number of word lines based on the different SGD lines. As used herein, a sub-block is a portion of a block that has channel element groups with SGD transistors configured to be biased by the same SGD line and/or with the same SGD line voltage. A sub-block may span, such as in the x-direction, across the m-number of word lines of a block. In addition, channel element groups with SGD transistors configured to be biased by different SGD transistors and/or with different SGD line voltages are part of different sub-blocks.

The number of sub-blocks of a block may be equal to the number of SGD lines. For example, the example block 480 of FIG. 14 includes four sub-blocks (SB) equal to the number of SGD lines, including a first sub-block SB1, a second sub-block SB2, a third sub-block SB3, and a fourth sub-block SB4. The first sub-block SB1 includes those channel element groups with SGD transistors SGD1 coupled to the first SGD line SGD1 and configured to be biased with a first SGD line voltage, the second sub-block SB2 includes those channel element groups with SGD cells SGD2 coupled to the second SGD line and configured to be biased with a second SGD line voltage, the third sub-block SB3 includes those channel element groups with SGD cells SGD3 coupled to the third SGD line and configured to be biased with a third SGD line voltage, and the fourth sub-block SB4 includes those channel element groups with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of channel element groups having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group or a string of memory cells. Otherwise stated, a word line cell group (or string) of memory cells is a plurality or a collection of memory cells coupled to the same word line layer, and that are part of channel element groups configured to be biased with the same SGD line voltage.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a block or of the memory cell structure 1042 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 442, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 442, including blocks and word line cell groups of the memory cell structure 442, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 442 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular, embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

The memory die 404 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 442 corresponding to and/or identified by the decoded row address when reading data from or programming/writing data into to the memory cell structure 442. The column decoder 150, which may also be referred to as a bit line decoder, a y decoder, or a y-wire decoder, may decode a column address (also referred to as a bit line address or a y address), and select a particular bit line or group of bit lines in the memory cell structure 442 corresponding to and/or identified by the column address, when reading data from or programming data to the memory cell structure 442.

In addition, the non-volatile memory die 404 may include a peripheral circuit 452. The peripheral circuit 452 may include a control logic circuit (also referred to as a control logic, an on-chip controller, or an on-die controller) 454, which, at least in some example embodiments, may be implemented as a state machine, that is configured to control on-chip memory operations as well as send status information to the controller 402. The peripheral circuit 452 may also include an on-chip address decoder 456 that provides an address interface between addressing used by the controller 402 and/or a host and the addressing used by the row and column decoders 448, 450, which can control signals to the first, second and third terminals 101, 103, 105. In addition, the peripheral circuit 452 may include volatile memory 458. An example configuration of the volatile memory 458 may include latches, although other configurations are possible.

In addition, the peripheral circuit 452 may include a power control circuit 460 that is configured to generate and supply control line voltages (including voltage pulses) to control lines of the memory cell structure 442. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 460 also be configured to generate and/or supply voltages other than the control lines voltages, including other voltages that may be supplied to the memory cell structure 442, the read/write circuits 444, the sense blocks 446, and/or other circuit components on the memory die 404.

The power control circuit 460 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 460 may communicate with and/or be controlled by the control logic circuit 454, the read/write circuits 444, and/or the sense blocks 446 in order to supply the voltages at appropriate levels and at appropriate times to carry out the memory operations.

During read operations, the power control circuit 460 may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit 460 to use to bias the word lines during read operations. The data structure may include multiple sets of read threshold levels; each corresponding to a different area of the memory dies 404. The control circuitry may also apply a signal to the third pillar to apply thermal energy to the pillar and reduce the voltage required to change the switch 100, 200 to the conducting state.

The memory system 400 may be configured to perform a read threshold calibration process that updates or revises one or more sets of the read threshold levels maintained in the data structure to more optimal values corresponding to changes in operating conditions. In various embodiments described herein, the read threshold calibration process that the memory system 400 performs may be based on bit error rates (BERs) determined from data read from the memory dies 404. The data read from the memory dies 404 to perform the calibration may be performed in response to host read requests. In addition or alternatively, the calibration may be a continuous process, such as a process continuously performed as host read requests are received, rather than as a discrete background process triggered by a certain metric, such as program/erase cycle count, as an example. Also, the calibration process may leverage the way in which the read/write circuit 444 reads data based on pages (e.g., lower, middle, upper) in order to determine voltage bins across a threshold voltage range over which the threshold voltage distribution curves extend, and BERs for those bins. Based on the determined BERs, the memory system 400 may determine in which direction to shift a read voltage level (increase or decrease), and by how much.

In further detail, the read/write circuit 444 may execute a read operation to read one or more pages of data from the memory dies 404. To do so, the read/write circuit 444 may execute the read operation in a sequence of stages dependent on the page types. For example, to read data from a page of MLC cells configured to store two bits-per-cell, the read/write circuit 444 may read the lower page first in a first stage, and then the upper page in a second stage. As another example, to read data from a page of MLC cells configured to store three bits-per-cell, the read/write circuit 444 may read the lower page first in a first stage, then the middle page in a second stage, and then the upper page in a third stage.

To read a given page, sense circuits of the sense blocks 446, coupled to the memory cells storing the page, perform a predetermined number of sense operations, each with the word lines coupled to the memory cells biased at an associated one of the read threshold voltage levels Vr. For an SLC storage scheme, the power control circuit 460 biases the word lines with the threshold voltage VrA associated with program state A, and the sense circuits perform a single sense operation. In response to the sense operation, the sense circuits identify those SLC cells in the erase state Er as storing a logic 1 value, and identify those SLC cells in memory state A as storing a logic 0 value.

For MLC storage schemes, to read a given page, sense circuits coupled to the memory cells storing the page perform multiple sense operations, such as two, three, or four sense operations, each with the word lines biased at a different one of the read threshold voltage levels Vr. The read threshold levels Vr that are applied depend on how many bits-per-cell the MLC cells are storing, which page is being read, and which number sense operation is being performed. In one example three bits-per-cell MLC storage scheme, to read a lower page, the sense circuits perform two sense operations, including a first sense operation with the word lines biased at the read threshold level VrA associated with memory state A, and a second sense operation with the word lines biased at the read threshold level VrE associated with memory state E. Read threshold voltage levels VrA and VrE applied during first and second sense operations are illustrated in FIG. 6.

The switches 100, 200 are driven into a low resistance or conductive state by a voltage in excess of a given threshold voltage value and remain in their conductive states until the current flow therethrough drops below a given holding current value. The switch devices 100, 200 are resettable to their relatively non-conductive state by application of a reset pulse. The switches 100, 200 can have their threshold voltages lowered by adding thermal energy to the switch by an electrical signal being applied to the pillar, i.e., the chalcogenide material.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A threshold switch for a vertical non-volatile memory, comprising:
   a source;
   a drain;
   a vertical channel extending from the source to the drain, wherein the channel includes a chalcogenide material, the channel including a first, resistive state and a second, conductive state, wherein the voltage difference between the source and the drain changes the channel from the first state to the second state when a threshold voltage is exceeded;
   an electrical insulation layer extending around the channel; and
   a conductive layer extending around the electrical insulation layer and the vertical channel, wherein the conductive layer receives an electrical signal to apply thermal energy to the vertical channel to lower the threshold voltage.

2. The threshold switch of claim 1, wherein the conductive layer receives a current to heat the channel and not apply an electrical field to change the conductivity of the channel.

3. The threshold switch of claim 1, wherein the electrical insulation layer separates the conductive layer from the vertical channel and is intermediate the drain and the conductive layer.

4. The threshold switch of claim 1, wherein the electrical insulation layer completely surrounds the channel.

5. The threshold switch of claim 4, wherein the conductive layer at least partly surrounds electrical insulation layer.

6. The threshold switch of claim 1, wherein the first state is amorphous and the second slate is electronic highly conductive.

7. The threshold switch of claim 1, wherein the channel is aligned with vertical memory cells.

8. The threshold switch of claim 1, wherein the electrical insulation layer includes a gate oxide material, and wherein the conductive layer includes a gate oxide.

9. The threshold switch of claim 1, wherein the source is connected to a global bit line in a nonvolatile memory.

10. The threshold switch of claim 1, wherein the drain is connected to a local bit line connected to a plurality of three dimensional memory cells.

11. The threshold switch of claim 1, wherein the second terminal is connected to a local bit line connected to a plurality of three dimensional memory cells.

12. The threshold switch of claim 11, wherein a first terminal is connected to a global bit line in a nonvolatile memory.

13. The threshold switch of claim 1, wherein the control signal at the third terminal outputs an electrical field that does not create a conduction channel in the pillar.

14. An electronic switching device comprising:
    a first terminal;
    a second terminal;
    a third terminal including an inner surface;
    an oxide layer on the inner surface of the third terminal; and
    a chalcogenide pillar extending through the oxide layer and the third terminal, the pillar being in electrical communication with the first terminal and the second terminal, wherein the voltage difference between the first terminal and the second terminal changes the channel from a first state to a second state when a threshold voltage between the first terminal and the second terminal is exceeded, the threshold voltage being dependent on temperature;
    wherein the third terminal is resistive and receives a control signal to apply heat to the pillar and modulate the threshold voltage.

15. The device of claim 14, wherein the vertical pillar includes Ge or Sb.

16. The device of claim 14, wherein the vertical pillar includes As, Se or Si.

17. The device of claim 14, wherein the vertical pillar includes an element selected from the group consisting of Al, In, Bi, Pb, Sn, P, and O.

18. The device of claim 14, wherein the first terminal is connected to a global bit line in a nonvolatile memory.

* * * * *